US012793753B2

(12) United States Patent
Du

(10) Patent No.: US 12,793,753 B2
(45) Date of Patent: Nov. 10, 2026

(54) STORAGE CHIP AND READ OPERATION METHOD

(71) Applicant: Wuhan Xinxin Semiconductor Manufacturing Co., Ltd., Wuhan (CN)

(72) Inventor: Yan Qiang Du, Wuhan (CN)

(73) Assignee: Wuhan Xinxin Semiconductor Manufacturing Co., Ltd., Wuhan (CN)

( * ) Notice: Subject to any disclaimer, the term of this patent is extended or adjusted under 35 U.S.C. 154(b) by 102 days.

(21) Appl. No.: 18/935,728

(22) Filed: Nov. 4, 2024

(65) Prior Publication Data

US 2025/0157506 A1 May 15, 2025

(30) Foreign Application Priority Data

Nov. 14, 2023 (CN) ........................ 202311529132.9

(51) Int. Cl.
*G11C 7/10* (2006.01)
*G11C 7/06* (2006.01)

(52) U.S. Cl.
CPC ............ *G11C 7/1069* (2013.01); *G11C 7/065* (2013.01); *G11C 7/106* (2013.01)

(58) Field of Classification Search
CPC ....... G11C 7/1069; G11C 7/065; G11C 7/106; G11C 7/06
USPC ..................................... 365/189.011, 189.05
See application file for complete search history.

(56) References Cited

U.S. PATENT DOCUMENTS 9,329,928 B2 * 5/2016 Fitzpatrick .......... G06F 11/1012
9,467,170 B2 * 10/2016 Chilappagari ..... H03M 13/1111
9,640,256 B1 * 5/2017 Roy ....................... H10B 10/12
2014/0344647 A1 * 11/2014 Chilappagari .... H03M 13/2927 714/773
2016/0365154 A1 12/2016 Nagadomi et al.
2017/0046220 A1 * 2/2017 Sharon .................. G06F 3/0679
2017/0206972 A1 7/2017 Nakayama
2023/0130365 A1 * 4/2023 Lu ...................... G11C 16/0483 365/185.18
2023/0290387 A1 * 9/2023 Raj ........................ G11C 5/025
2024/0055032 A1 * 2/2024 Khera .................. G11C 7/1048

FOREIGN PATENT DOCUMENTS

TW 202105380 2/2021

OTHER PUBLICATIONS

Official Letter and Search Report Dated Sep. 5, 2024 From the Intellectual Property Office, Ministry of Economic Affairs of the Republic of Taiwan, R.O.C. Re. Application No. 112149370 and Its Translation Into English. (16 Pages).

* cited by examiner

*Primary Examiner* — Michael T Tran

(57) ABSTRACT

The present disclosure provides a storage chip and a read operation method. The storage chip includes a sensitive amplification module and a selection latch module. The sensitive amplification module reads and latches storage data having a first bit width as pre-read data having the first bit width, and the selection latch module selects and latches read data having a second bit width from the pre-read data.

13 Claims, 6 Drawing Sheets

STORAGE CHIP AND READ OPERATION METHOD

RELATED APPLICATION

This application is a Paris Convention which claims the benefit of priority of Chinese Patent Application No. 202311529132.9 filed on Nov. 14, 2023. The contents of the above application is all incorporated by reference as if fully set forth herein in its entirety.

FIELD AND BACKGROUND OF THE INVENTION

The present application relates to the field of storage technologies, and more particularly to a storage chip and a read operation method.

With the development of technologies, applications of a storage chip are becoming more and more widespread. These applications impose higher requirements on a capacity, a read-write data speed, and power consumption of the storage chip. In order to increase the speed of reading data, the storage chip may be implemented by increasing the number of sensitive amplifiers. Each of the sensitive amplifiers corresponds to one bit of read data. As the number of sensitive amplifiers is increased, the data bit width of the read operation can be increased, so that the speed of reading data is increased.

However, in order to improve a yield of the storage chip, the storage chip generally need to be configured with redundant replacement. Increase in each data bit width of the read operation requires addition of a redundant replacement circuit, which greatly increases the difficulty of wirings and the area of the storage chip.

SUMMARY OF THE INVENTION

The present application provides a storage chip and a read operation method so as to alleviate the technical problem of a higher number of redundant replacement circuits in the read operation at a higher speed.

In a first aspect, the present application provides a storage chip, including: a sensitive amplification module, where the sensitive amplification module is configured to read and latch storage data having a first bit width as pre-read data having the first bit width; and a selection latch module, where the selection latch module is configured to select and latch read data having a second bit width less than the first bit width from the pre-read data.

In some embodiments of the present application, the sensitive amplification module includes: a plurality of sensitive amplifiers, where the plurality of sensitive amplifiers are configured to read the storage data according to one or more read commands; and a plurality of first latches, where the plurality of first latches are configured to latch the pre-read data according to one or more latch enable signals.

In some embodiments of the present application, the selection latch module includes one selection latch submodule or two selection latch submodules connected to each other.

In some embodiments of the present application, the selection latch module includes one selection latch submodule, including: a data selector, where the data selector is configured to select the read data having the second bit width from the pre-read data, the second bit width is one N-th of the first bit width, and N is an integer greater than or equal to 2; and a plurality of second latches connected to the data selector, where each of the second latches is configured to latch the read data.

In some embodiments of the present application, the selection latch module includes: a first selection latch submodule, where the first selection latch submodule is configured to select and latch second pre-read data having a third bit width from the pre-read data, and the third bit width is one X-th of the first bit width; and a second selection latch submodule, where the second selection latch submodule is configured to select and latch pre-read data having a second bit width from the second pre-read data, the second bit width is one-Y-th of the third bit width; where X and Y are both integers greater than or equal to 2.

In some embodiments, the first selection latch submodule includes a first data selector and a plurality of second latches, and the first data selector is connected to the sensitive amplification module and the plurality of second latches; and the second selection latch submodule includes a second data selector and a plurality of third latches, and the second data selector is connected to the plurality of second latches and the plurality of third latches; where each of the second latches and the third latches is configured to latch data.

In some embodiments of the present application, the selection latch module includes one selection latch submodule, including: a data selector, where the data selector is configured to select the read data having the second bit width from the pre-read data, the second bit width is one M-th of the first bit width, and M is an integer greater than or equal to 4; and a plurality of second latches connected to the data selector, where each of the second latches is configured to latch the read data.

In some embodiments of the present application, the latch enable signals include a first latch enable signal and a second latch enable signal; the sensitive amplification module is configured to read a portion of the storage data from the storage data having the first bit width under the control of one of the first latch enable signal and the second latch enable signal; and the sensitive amplification module is configured to read another portion of the storage data from the storage data having the first bit width under the control of another one of the first latch enable signal and the second latch enable signal.

In some embodiments of the present application, the sensitive amplification module is configured to read high bits or odd bits of storage data from the storage data having the first bit width under the control of one of the first latch enable signal and the second latch enable signal; and the sensitive amplification module is configured to read low bits or even bits of storage data from the storage data having the first bit width under the control of another one of the first latch enable signal and the second latch enable signal.

In some embodiments of the present application, the data selector is a quad data selector.

In some embodiments of the present application, each of the read commands corresponds to respective one of read operations, each of the read operations includes a first read operation and at least one other read operation sequentially, and the latch enable signals include more than two latch enable signals; in the first reading operation, all of the sensitive amplifiers and the first latches in the sensitive amplification module are operable to read and latch the storage data having the first bit width as the pre-read data having the first bit width; and in the other read operation, a portion of the sensitive amplifiers and a portion of the first latches of the sensitive amplification module are operable to update and latch respective portion of the storage data having the first bit width as the pre-read data having the first bit width under the control of at least one first latch enable signal or at least one second latch enable signal.

In some embodiments of the present application, each of the sensitive amplifiers is configured to read 1 bit of storage data, and each of the first latches is connected to respective one of the sensitive amplifiers and configured to latch 1 bit of pre-read data.

In some embodiments, the second bit width is an integer multiple of 8 bits.

In a second aspect, the present application provides a read operation method, including: reading and latching storage data having a first bit width as pre-read data having the first bit width; and selecting and latching read data having a second bit width less than the first bit width from the pre-read data.

In some embodiments of the present application, reading and latching the storage data having the first bit width include: reading and latching the storage data having the first bit width as pre-read data having the first bit width according to read commands and latch enable signals.

In some embodiments of the present application, reading and latching the storage data having the first bit width as the pre-read data having the first bit width according to the read commands and the latch enable signals include: reading the storage data having the first bit width according to the read commands; and latching the storage data as the pre-read data according to the latch enable signals.

In some embodiments of the present application, selecting and latching the read data having the second bit width from the pre-read data include: selecting the read data having the second bit width from the pre-read data, where the second bit width is one N-th of the first bit width, and N is an integer greater than or equal to 2; and latching the read data.

In some embodiments of the present application, selecting and latching the read data having the second bit width from the pre-read data include: selecting and latching second pre-read data having a third bit width from the pre-read data, where the third bit width is one X-th of the first bit width, and X is an integer greater than or equal to 2; and selecting and latching the read data having the second bit width from the second pre-read data, where the second bit width is one Y-th of the third bit width and Y is an integer greater than or equal to 2.

In some embodiments of the present application, selecting and latching the second pre-read data having the third bit width from the pre-read data include: selecting the second pre-read data from the pre-read data; and latching the second pre-read data.

In some embodiments of the present application, selecting and latching the read data having the second bit width being one Y-th of the third bit width from the second pre-read data include: selecting the pre-read data from the second pre-read data; and latching the pre-read data.

In some embodiments of the present application, the read operation method further includes: after the first read operation or the other read operation, selecting read data having a second bit width from the pre-read data, where the second bit width is one M-th of the first bit width, and M is an integer greater than or equal to 4; and latching the read data.

According to the storage chip and the read operation method provided in the present application, a frequency of the read commands is positively related to the first bit width, and thus the first bit width can be increased with the increase of the frequency of the read commands, thereby improving the speed of the read operations; and the second bit width is less than the first bit width, and thus the second bit width of the read data can be reduced on the basis of ensuring the speed of the read operations. Since each bit of the read data requires one redundant replacement circuit to process the read data, the number of redundant replacement circuits required for processing the read data can be reduced with the reduction of the second bit width of the read data, thereby reducing the difficulty of wiring and the area of the storage chip.

In addition, since each bit of the read data further requires one latch in the selection latch module to latch the read data, the number of latches in the selection latch module is reduced as the second bit width of the read data is reduced, so that the area of the storage chip can be further reduced.

BRIEF DESCRIPTION OF THE DRAWINGS

Technical solutions and other beneficial effects of the present application are apparent below from detailed description of the embodiments of the present application in combination with the accompanying drawings.

DESCRIPTION OF SPECIFIC EMBODIMENTS OF THE INVENTION

Technical solutions in embodiments of the present application will be clearly and completely described below in conjunction with drawings in the embodiments of the present application. Obviously, the described embodiments are only a part of embodiments of the present application, rather than all the embodiments. Based on the embodiments in the present application, all other embodiments obtained by those skilled in the art without creative work fall within the protection scope of the present application.

In addition, the term “first” and “second” are for illustrative purposes only and are not to be construed as indicating or imposing a relative importance or implicitly indicating the number of technical features indicated, such that features defined by “first” and “second” may explicitly or implicitly include one or more of the recited features. In the description of the present application, the meaning of “plurality” is two or more, unless otherwise specifically defined.

Figure 1:
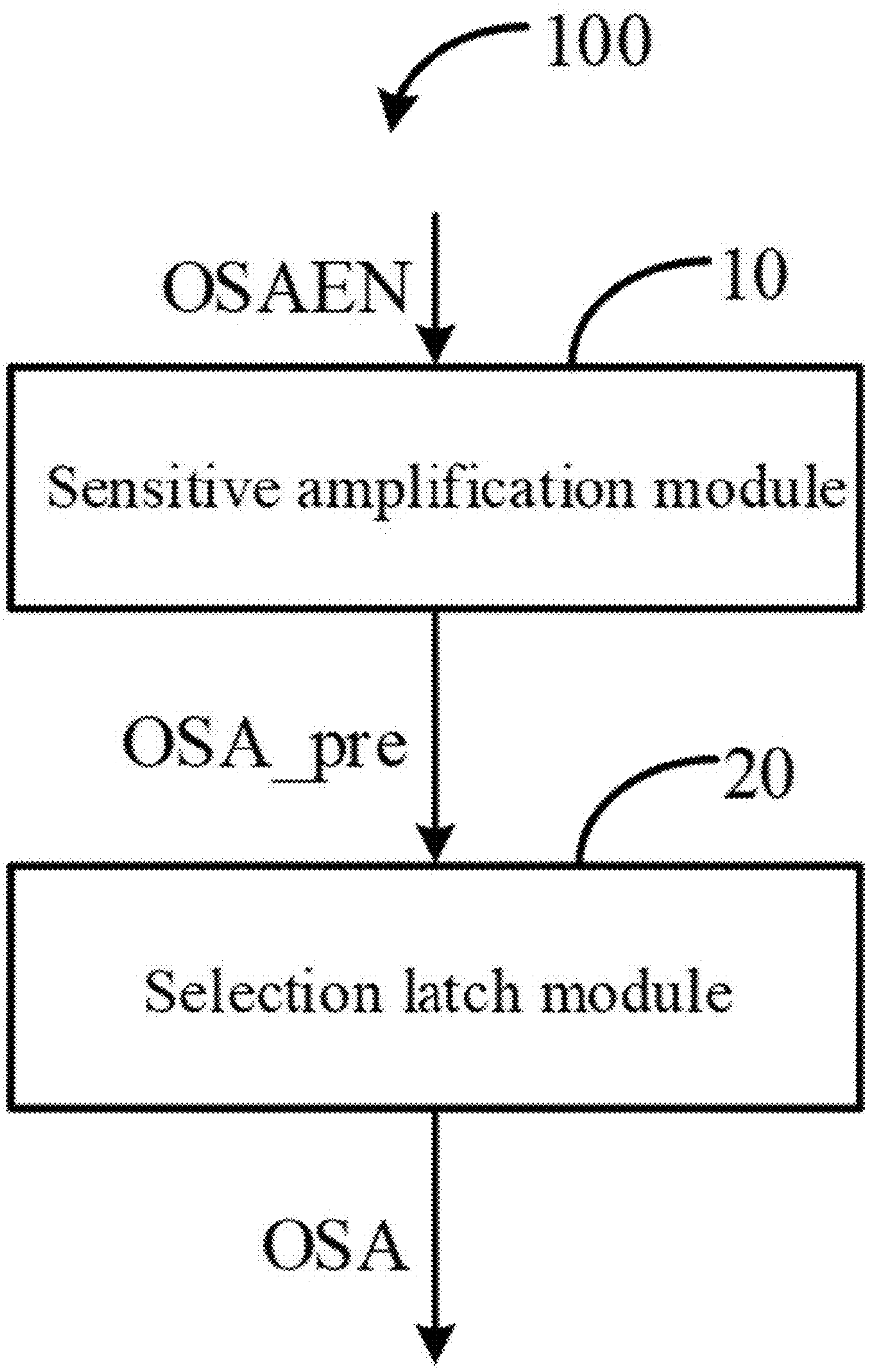
FIG. 1 is a schematic diagram of a first structure of a storage chip according to some embodiments of the present application.

The embodiments provide a storage chip 100, referring to FIGS. 1 to 4. As shown in FIG. 1, the storage chip 100 includes a sensitive amplification module 10 and a selection latch module 20 The sensitive amplification module 10 is configured to read and latch storage data having a first bit width as pre-read data having the first bit width. The selection latch module 20 is configured to select and latch read data having a second bit width less than the first bit width from the pre-read data.

It should be understood according to the storage chip 100 and the read operation method provided in the embodiments, a frequency of the read commands is positively related to the first bit width, and thus the first bit width can be increased with the increase of the frequency of the read commands, thereby improving the speed of the read operations; and the second bit width is less than the first bit width, and thus the second bit width of the read data can be reduced on the basis of ensuring the speed of the read operations. Since each bit of the read data requires one redundant replacement circuit to process the read data, the number of redundant replacement circuits required for processing the read data can be reduced with the reduction of the second bit width of the read data, thereby reducing the difficulty of wiring and the area of the storage chip 100.

In addition, since each bit of the read data further requires one latch in the selection latch module 20 to latch the read data, the number of latches in the selection latch module 20 is reduced as the second bit width of the read data is reduced, so that the area of the storage chip 100 can be further reduced.

It should be noted that OSAEN is used to represent a latch enable signal. OSA_pre is used to represent pre-read data. OSA is used to represent read data.

The frequency of the read commands or the frequency of the read data is positively related with the first bit width. Each bit width in the present application refers to the amount of data that can be processed at a time.

Figure 5:
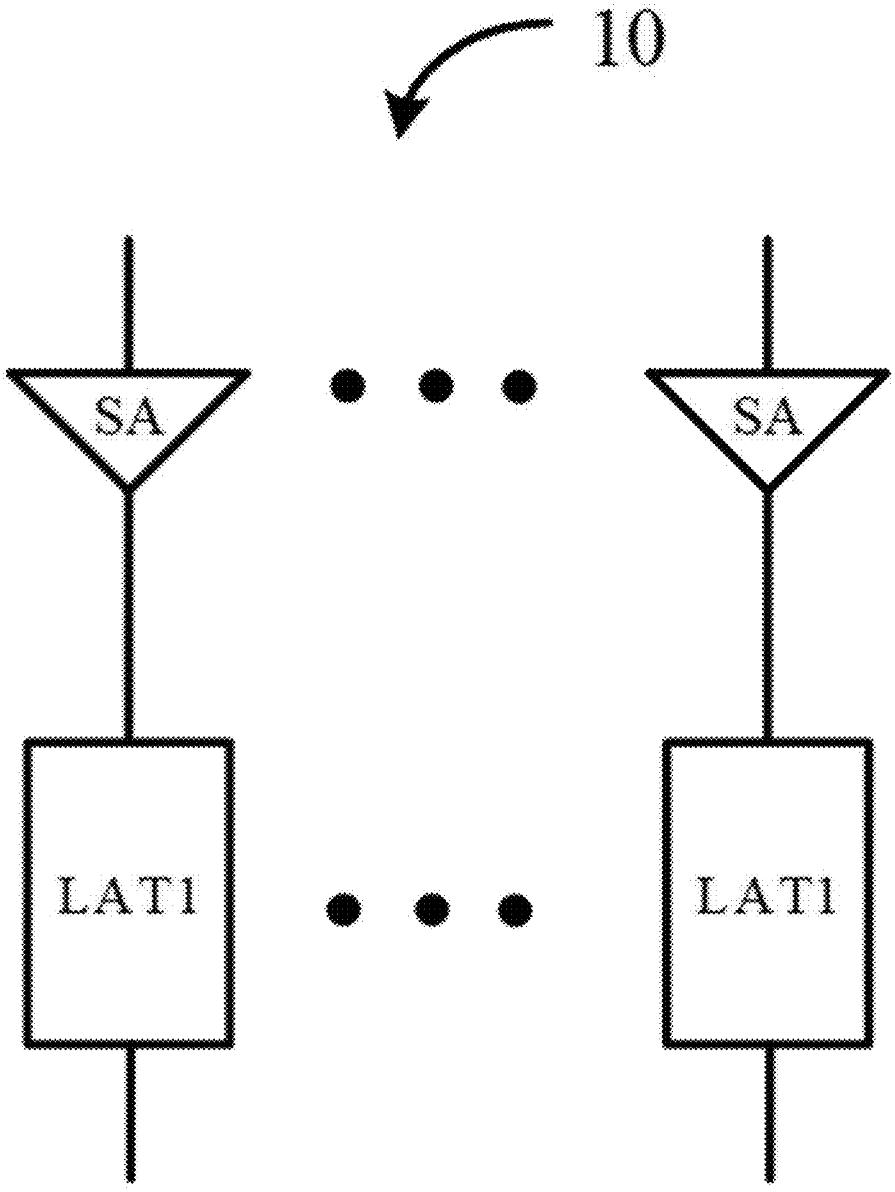
FIG. 5 is a schematic structural diagram of a sensitive amplification module according to some embodiments of the present application.

In some embodiments of the present application, as shown in FIG. 5, the sensitive amplification module 10 includes: a plurality of sensitive amplifiers SA, where the plurality of sensitive amplifiers SA are configured to read the storage data according to one or more read commands; and a plurality of first latches LAT1, where the plurality of first latches LAT1 are configured to latch the pre-read data according to one or more latch enable signals.

It should be noted that a structure of the sensitive amplification module 10 shown in FIG. 5 can be applied to an architecture of any one of the storage chips 100 in FIGS. 1 to 4. Each of the sensitive amplifiers SA is used to read 1 bit of storage data. Each of the first latches LAT1 is connected to respective one of the sensitive amplifiers SA. Each of the first latches LAT1 is configured to latch 1 bit of pre-read data.

It should be noted that the speed of the read operations also need to be increased as the frequency of the read commands are increased. The read operations may be divided into a low-speed read operation and a high-speed read operation according to a threshold frequency. The threshold frequency may be any of 90 MHz-120 MHz, and in some embodiments, 104 MHz. In some embodiments, the threshold frequency is not limited to a range of 90 MHz-120 MHz, but may be other frequency. Of course, the description of the threshold frequency is not limited thereto, and the threshold frequency can be designed to define a low-speed reading and a high-speed reading according to practical application requirements.

Specifically, an example in which the threshold frequency is 104 MHz is taken for illustration. A read operation corresponding to a read command having a frequency less than 104 MHz is used as a low-speed read operation. A read operation corresponding to a read command having a frequency greater than or equal to 104 MHz is used as a high-speed read operation.

In order to satisfy the requirements of the read command having a frequency of 104 MHz, such as a read command not provided with a redundant clock cycle, each of read commands corresponds to respective one of read operations, and each of the read operations may include a first read operation, a second read operation, a third read operation, and so on. The first read operation requires the sensitive amplification module 10 to include at least 128 sensitive amplifiers SA. In the same read operation, various read operations after the first read operation may be other read operations, for example, a second read operation and a third read operation, and so on.

Figure 2:
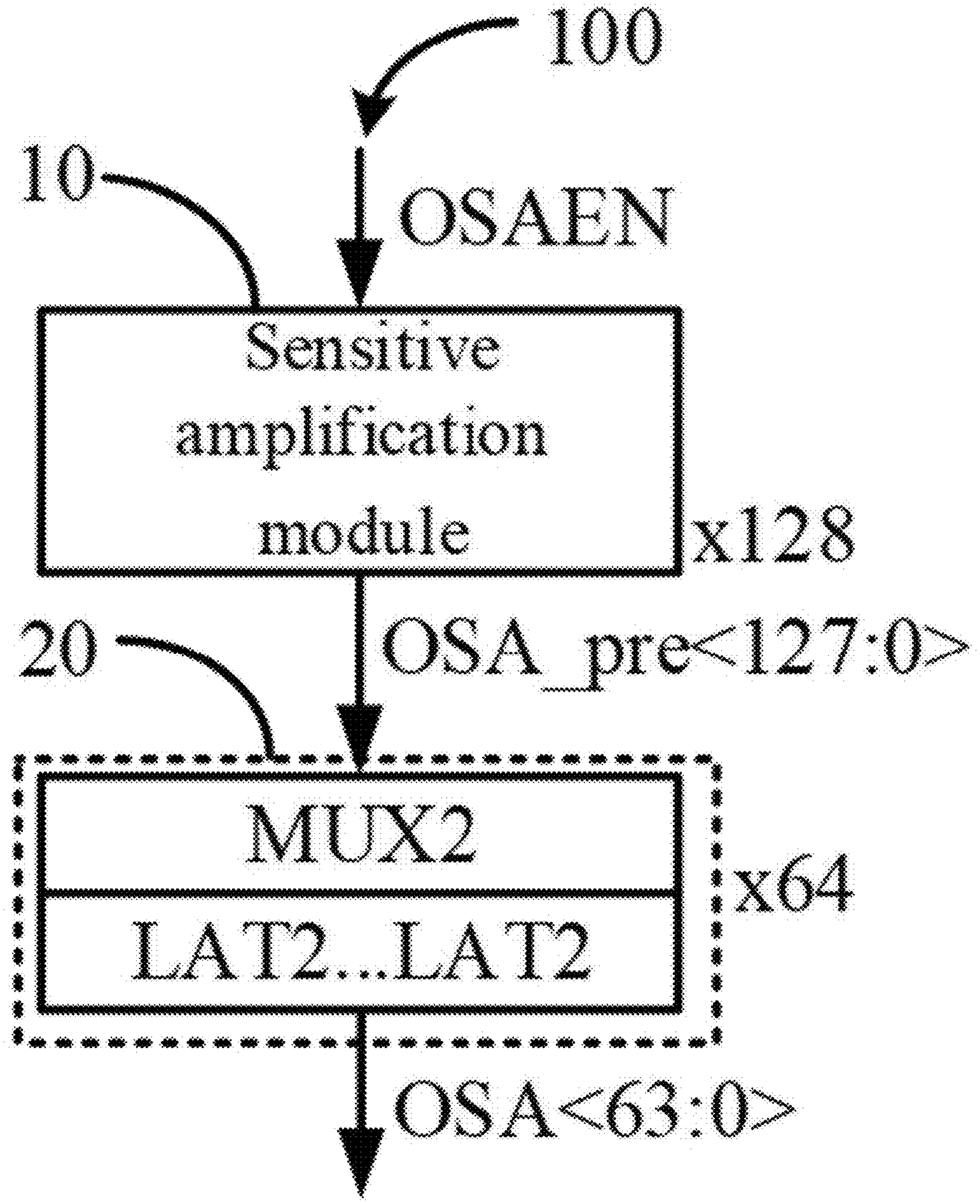
FIG. 2 is a schematic diagram of a second structure of a storage chip according to some embodiments of the present application.
Figure 3:
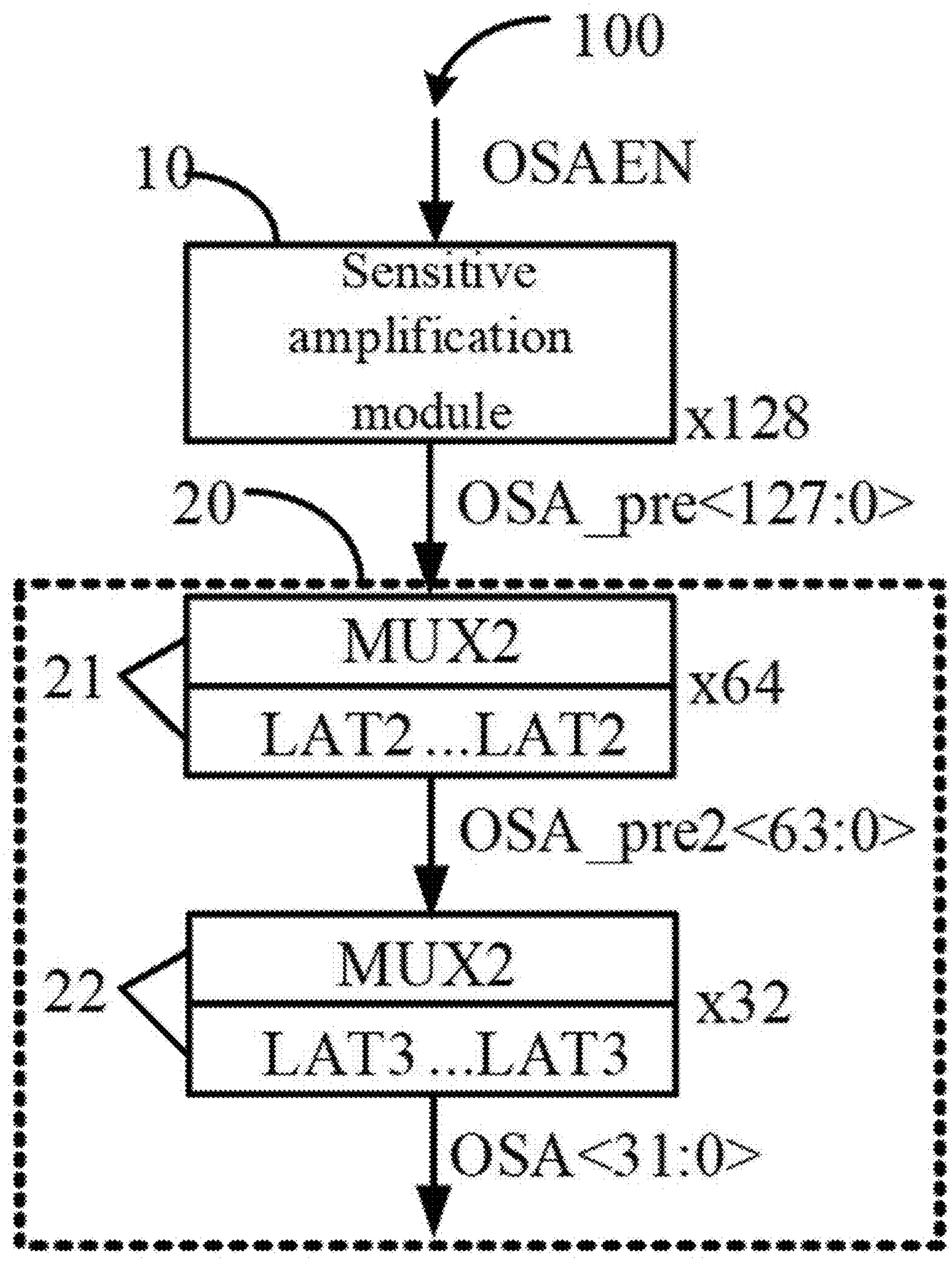
FIG. 3 is a schematic diagram of a third structure of a storage chip according to some embodiments of the present application.
Figure 4:
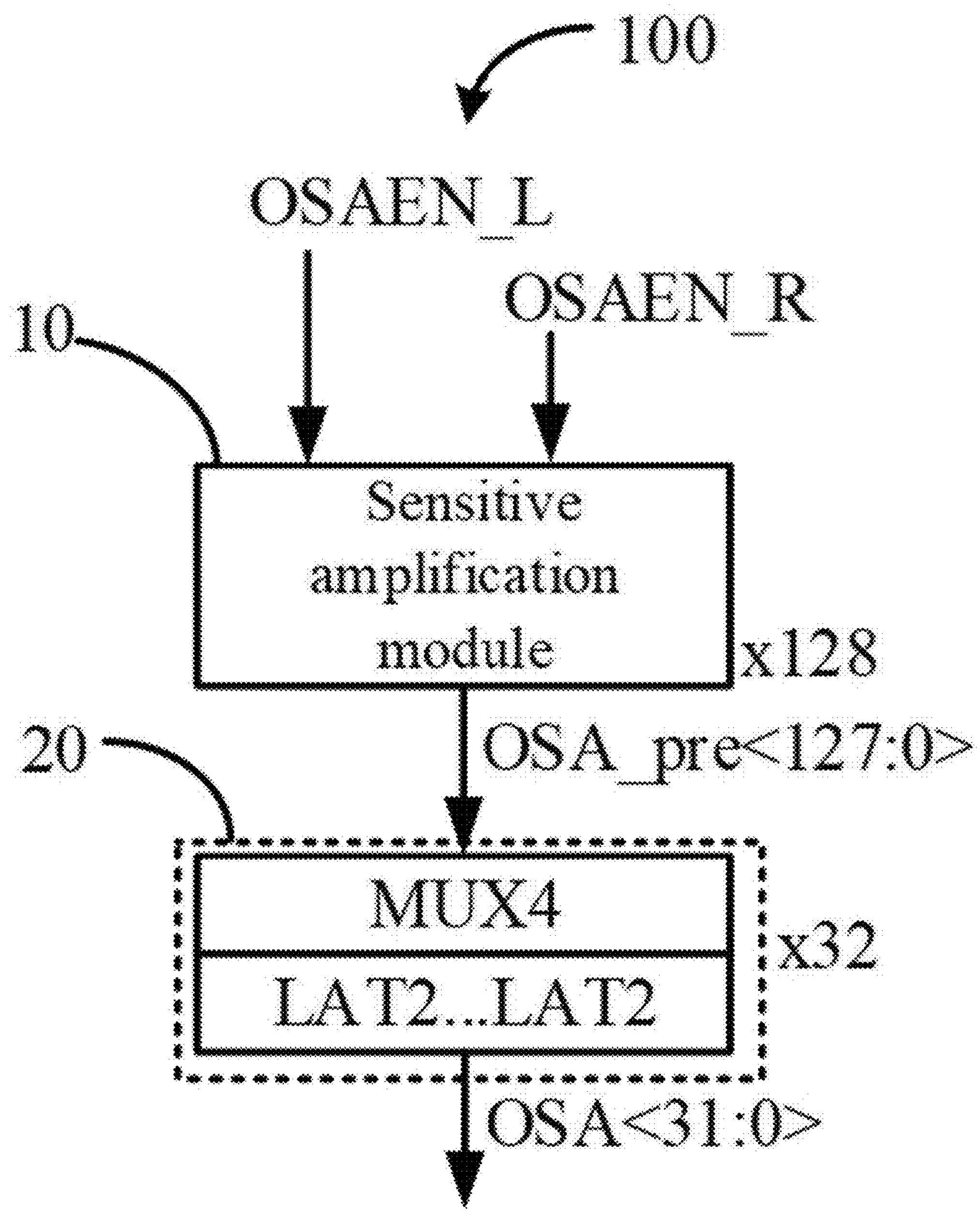
FIG. 4 is a schematic diagram of a fourth structure of a storage chip according to some embodiments of the present application.

In this example, FIGS. 2 to 4 provide embodiments of the storage chip 100, respectively.

The storage chip 100 shown in FIG. 2 is used as the first embodiment as follows.

In the first embodiment, as shown in FIG. 5, the sensitive amplification module 10 includes 128 sensitive amplifiers SA and 128 first latches LAT1. Each of the sensitive amplifiers SA may read one bit of read data from one storage cell in a storage array. Each of the first latches LAT1 may latch one bit of read data output from respective one of the sensitive amplifiers SA. Each of the sensitive amplifiers SA is connected to respective one of the first latches LAT1.

In response to determining receipt of a read command, the 128 sensitive amplifiers SA synchronously or in parallel read 128 bits of read data from the storage array in each of read operations. Then, the 128 first latches LAT1 latch the 128 bits of read data, respectively. At the time of outputting of the read data, the sensitive amplifier module 10 provides 128 bits of pre-read data, i.e., OSA_pre<127:0>.

When a potential of a latch enable signal OSAEN is switched from a high potential to a low potential, it indicates that the 128 bits of read data read in the present read operation has been latched by the respective first latches LAT1, and the read operation has ended. The sensitive amplifiers SA may begin next read operation.

Next, the selection latch module 20 in the present embodiment has a selection latch submodule including 64 data selectors (MUX2) and 64 second latches LAT2, where each of output terminals of the data selectors is connected to respective one of the second latches LAT2.

The data selectors (MUX2) select 64 bits of read data, i.e., OSA<63:0>, from 128 bits of pre-read data, i.e., OSA_pre<127:0>, and latch the 64 bits of read data, i.e., OSA<63:0> with the 64 second latches LAT2.

It should be understood that only 64 second latches LAT2 are required in the first embodiment, which reduces the number of the used second latches LAT2 compared to a scheme using 128 second latches LAT2, and thus reduces the area of the storage chip 100.

Additionally, since one bit of read data can be processed by each of redundant replacement circuits, the number of the redundant replacement circuits required in the present embodiment is reduced, which also reduces the difficulty of wiring and the area of the storage chip 100.

Additionally, there is only one selection latch submodule in the first embodiment, which reduces delay in a transmission path compared to the case where there are two selection latch submodules.

It should be noted that an example in which N is equal to 2 is taken in the first embodiment for illustration, that is, the second bit width is half of the first bit width, and in other embodiments, N may also be an integer, such as, 4, 6, 8, . . . . Each of the second latches LAT2 is configured to latch 1 bit of read data.

The storage chip 100 shown in FIG. 3 is used as the second embodiment as follows.

In the second embodiment, as shown in FIG. 5, the sensitive amplification module 10 includes 128 sensitive amplifiers SA and 128 first latches LAT1. Each of the sensitive amplifiers SA may read one bit of read data from one storage cell in a storage array. Each of the first latches LAT1 may latch one bit of read data output from respective one of the sensitive amplifiers SA. Each of the sensitive amplifiers SA is connected to respective one of the first latches LAT1.

In response to determining receipt of a read command, the 128 sensitive amplifiers SA synchronously or in parallel read 128 bits of read data from the storage array in each of read operations. Then, the 128 first latches LAT1 latch the 128 bits of read data, respectively. At the time of outputting of the read data, the sensitive amplifier module 10 provides 128 bits of pre-read data, i.e., OSA_pre<127:0>.

When a potential of a latch enable signal OSAEN is switched from a high potential to a low potential, it indicates that the 128 bits of read data read in the present read operation has been latched by the respective first latches LAT1, and the read operation has ended. The sensitive amplifiers SA may begin next read operation.

Next, the selection latch module 20 in the present embodiment has two selection latch submodules including a first selection latch submodule 21 and a second selection latch submodule 22. The first selection latch submodule 21 includes 64 first data selectors (MUX2) and 64 second latches LAT2 (LAT2), where the first data selectors are connected to the 128 first latches LAT1 and the 64 second latches LAT2. The second selection latch submodule 22 includes 32 second data selectors (MUX2) and 32 third latches LAT3 (LAT3), where the 32 second data selectors are connected to the 64 second latches LAT2 and the 32 third latches LAT3.

Each of input terminals of the first data selectors is connected to respective one of output terminals of the first latches LAT1, and each of output terminals of the first data selectors is connected to respective one of input terminals of the second latches LAT2. Each of input terminals of the second data selectors is connected to respective one of output terminals of the second latches LAT2, and each of output terminals of the second data selectors is connected to respective one of input terminals of the third latches LAT3.

The first data selectors (MUX2) select 64 bits of second pre-read data, i.e., OSA_pre2<63:0>, from 128 bits of pre-read data, i.e., OSA_pre<127:0>, and latch the 64 bits of second pre-read data, i.e., OSA_pre2<63:0> with the 64 second latches LAT2.

The second data selectors (MUX2) select 32 bits of read data, i.e., OSA<31:0>, from 64 bits of the second pre-read data, i.e., OSA_pre2<63:0>, and latch the 32 bits of read data, i.e., OSA<31:0> with the 32 third latches LAT3.

It should be understood that the second embodiment only needs to process 32 bits of read data. Since one bit of read data can be processed by each of redundant replacement circuits, the number of the redundant replacement circuits required in the present embodiment is reduced compared with the case of needing to process 64 bits of read data in the first embodiment, which also reduces the difficulty of wiring and the area of the storage chip 100.

It should be noted that an example in which X and Y are both equal to 2 is taken in the second embodiment for illustration, that is, the third bit width is half of the first bit width. The second bit width is half of the third bit width, and in other embodiments, X and Y may also be integers, such as, 4, 6, 8, . . . . Each of the second latches LAT2 and the third latches LAT3 is configured to latch 1 bit of read data.

The storage chip 100 shown in FIG. 4 is used as the third embodiment as follows.

In the third embodiment, as shown in FIG. 5, the sensitive amplification module 10 includes 128 sensitive amplifiers SA and 128 first latches LAT1. Each of the sensitive amplifiers SA may read one bit of read data from one storage cell in a storage array. Each of the first latches LAT1 may latch one bit of read data output from respective one of the sensitive amplifiers SA. Each of the sensitive amplifiers SA is connected to respective one of the first latches LAT1.

In response to determining receipt of a read command, the 128 sensitive amplifiers SA synchronously or in parallel read 128 bits of read data from the storage array in the first read operation; and the 128 first latches LAT1 latch the 128 bits of read data, respectively, to provide 128 bits of pre-read data, i.e., OSA_pre<127:0>, at the time of output of the read data. Thereafter, the data selectors (MUX4) select the OSA_pre<63:32> from the OSA_pre<127:0> and the 32 second latches LAT2 latch 32 bits of read data, i.e., the OSA<31:0>. Then, the 64 sensitive amplifiers SA of the 128 sensitive amplifiers SA read 64 bits of read data from the storage array in the second read operation under the control of one of the first latch enable signal, i.e., the OSAEN_L, and the second latch enable signal, i.e., the OSAEN_R, to update the OSA_pre<63:0> in the OSA_pre<127:0>. Thereafter, the data selectors (MUX4) select OSA_pre<127:96> from the OSA_pre<127:0> and the 32 second latches LAT2 latch 32 bits of read data, i.e., OSA<31:0>. Then, other 64 sensitive amplifiers of the 128 sensitive amplifiers SA read 64 bits of read data from the storage array in the third read operation under the control of another one of the first latch enable signal, i.e., OSAEN_L, and the second latch enable signal, i.e., OSAEN_R, to update the OSA_pre<127:64> in the OSA_pre<127:0>.

When a potential of either the first latch enable signal, i.e., OSAEN_L, or the second latch enable signal, i.e., OSAEN_R is switched from a high potential to a low potential, it indicates that the 64 bits of OSA_pre<63:0> or 64 bits of OSA_pre<127:64> read in the present read operation has been latched by the respective first latches LAT1, and the read operation has ended. When a potential of either the first latch enable signal, i.e., OSAEN_L, or the second latch enable signal, i.e., OSAEN_R is switched from a high potential to a low potential, the sensitive amplifiers SA may start next read operation.

Each of input terminals of the data selectors (MUX4) is connected to respective one of output terminals of the first latches LAT1, and each of output terminals of the data selectors (MUX4) is connected to respective one of input terminals of the second latches LAT2.

It should be understood that the third embodiment only needs to process 32 bits of read data. Since one bit of read data can be processed by each of redundant replacement circuits, the number of the redundant replacement circuits required in the present embodiment is reduced compared to the case of needing to process the 64 bits of read data in the first embodiment, which also reduces the difficulty of wiring and the area of the storage chip 100.

Additionally, in the third embodiment, the first latches LAT1 in the sensitive amplification module 10 are used to perform bit width conversion from 128 bits to 64 bits. Compared with the second embodiment, the third embodiment reduces 64 latches. Since only one stage of latch submodule is used, the chip area is reduced while delay of data transmission is optimized.

In addition, since only half of the number of sensitive amplifiers SA are operated in other read operation after the first read operation, it also has less noise effect on the chip and the accuracy of the read operation is also higher.

It should be noted that an example in which M is equal to 4 is taken in the third embodiment for illustration, that is, the second bit width is quarter of the first bit width, and in other embodiments, M may also be an integer, such as, 6, 8, 12, and so on. Each of the second latches LAT2 and the third latches LAT3 is configured to latch 1 bit of respective data.

In some embodiments of the present application, the second bit width is an integer multiple of 8 bits (bits), for example, 8 bits, 16 bits, 32 bits, 64 bits, and so on, which enables the storage chip 100 to read out in bytes.

Figure 6:
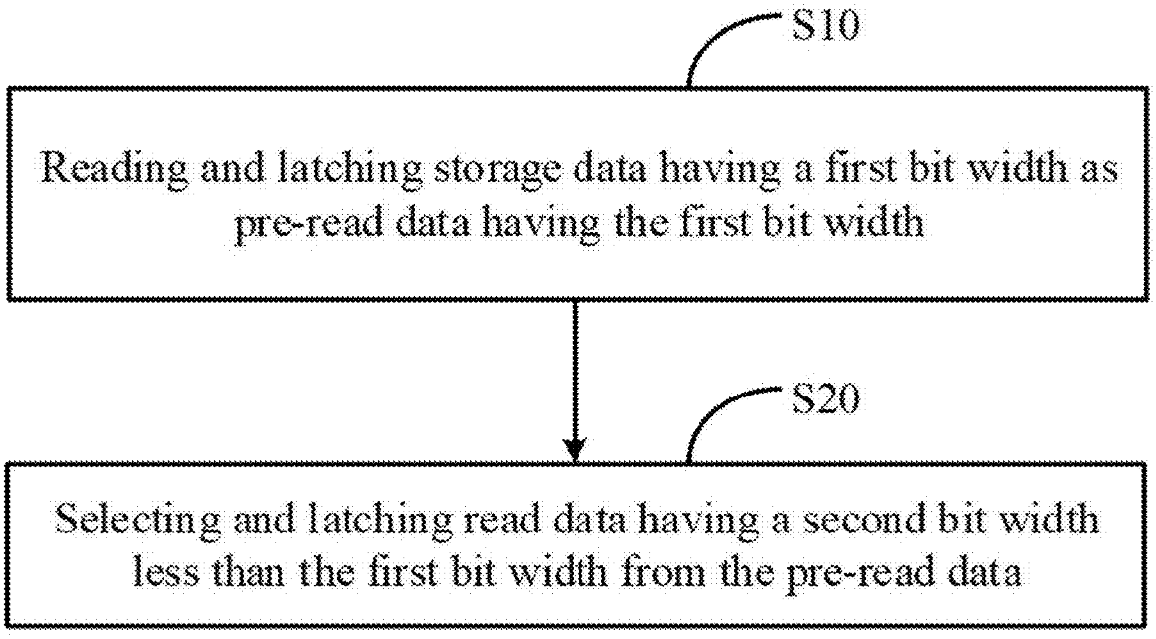
FIG. 6 is a flow diagram of a read operation method according to some embodiments of the present application.

In some embodiments of the present application, the embodiments provide a read operation method, as shown in FIG. 6. The read operation method includes: S10: reading and latching storage data having a first bit width as pre-read data having the first bit width; and S20: selecting and latching read data having a second bit width less than the first bit width from the pre-read data.

It should be understood according to the read operation method provided in the embodiments, a frequency of the read commands is positively related to the first bit width, and thus the first bit width can be increased with the increase of the frequency of the read commands, thereby improving the speed of the read operations; and the second bit width is less than the first bit width, and thus the second bit width of the read data can be reduced on the basis of ensuring the speed of the read operations. Since each bit of the read data requires one redundant replacement circuit to process the read data, the number of redundant replacement circuits required for processing the read data can be reduced with the reduction of the second bit width of the read data, thereby reducing the difficulty of wiring and the area of the storage chip.

In addition, since each bit of the read data further requires one latch in the selection latch module to latch the read data, the number of latches in the selection latch module is reduced as the second bit width of the read data is reduced, so that the area of the storage chip can be further reduced.

It should be understood that bit widths such as the first bit width, the second bit width, the third bit width, and the like may be dynamic, that is, different bits of data are processed at a time according to different read patterns, and/or may also be understood as the maximum number of bits of data that respective data processing device can process.

It should be noted that the read operation method can be applied to a storage chip, for example, Nor Flash.

In the foregoing embodiments, descriptions of the embodiments are emphasized. A portion that is not described in detail in an embodiment may refer to related descriptions in another embodiment.

The storage chip and the read operation method provided in the embodiments of the present application are described in detail above. In this specification, principles and implementations of the present application are illustrated by applying specific examples herein. The description of the above embodiments is only used to help understand the technical solutions and core ideas of the present application; those of ordinary skill in the art should understand that it is still possible to modify the technical solutions recorded in the foregoing embodiments, and these modifications or replacements do not cause the essence of the corresponding technical solutions to deviate from the scope of the technical solutions of the embodiments of the present application.

What is claimed is:

1. A storage chip, comprising:

a sensitive amplification module, wherein the sensitive amplification module is configured to read and latch storage data having a first bit width as pre-read data having the first bit width; and a selection latch module, wherein the selection latch module is configured to select and latch read data having a second bit width less than the first bit width from the pre-read data;

wherein the sensitive amplification module comprises a plurality of sensitive amplifiers, the plurality of sensitive amplifiers being configured to read the storage data based on one or more read commands, and a plurality of first latches, the plurality of first latches being configured to latch the pre-read data based on one or more latch enable signals;

wherein the selection latch module comprises one selection latch submodule, and the selection latch submodule comprises a data selector and a plurality of second latches connected to the data selector, wherein the data selector is configured to select the read data having the second bit width from the pre-read data, the second bit width being one N-th of the first bit width, N being an integer greater than or equal to 2, and each of the second latches is configured to latch the read data.

2. The storage chip of claim 1, wherein the second bit width is one M-th of the first bit width, and M is an integer greater than or equal to.

3. The storage chip of claim 2, wherein the latch enable signals comprise a first latch enable signal and a second latch enable signal;

the sensitive amplification module is configured to read a portion of the storage data from the storage data having the first bit width under the control of one of the first latch enable signal and the second latch enable signal; and the sensitive amplification module is configured to read another portion of the storage data from the storage data having the first bit width under the control of another one of the first latch enable signal and the second latch enable signal.

4. The storage chip of claim 3, wherein the sensitive amplification module is configured to read high bits or odd bits of the storage data from the storage data having the first bit width under the control of one of the first latch enable signal and the second latch enable signal; and the sensitive amplification module is configured to read low bits or even bits of the storage data from the storage data having the first bit width under the control of another one of the first latch enable signal and the second latch enable signal.

5. The storage chip of claim 3, wherein each of the read commands corresponds to respective one of read operations, each of the read operations comprises a first read operation and at least one other read operation sequentially, and the latch enable signals comprise more than two latch enable signals;

in the first reading operation, all of the sensitive amplifiers and the first latches in the sensitive amplification module are operable to read and latch the storage data having the first bit width as the pre-read data having the first bit width; and in the other read operation, a portion of the sensitive amplifiers and a portion of the first latches of the sensitive amplification module are operable to update and latch respective portion of the storage data having the first bit width as the pre-read data having the first bit width under the control of at least one of the latch enable signals.

6. The storage chip of claim 1, wherein each of the sensitive amplifiers is configured to read 1 bit of storage data, and each of the first latches is connected to respective one of the sensitive amplifiers and configured to latch 1 bit of pre-read data.

7. A read operation method, comprising:

reading and latching storage data having a first bit width as pre-read data having the first bit width; and selecting and latching read data having a second bit width less than the first bit width from the pre-read data;

wherein the reading and latching of the storage data having the first bit width comprise:

reading and latching the storage data having the first bit width as the pre-read data having the first bit width based on read commands and latch enable signals, comprising:

reading the storage data having the first bit width based on the read commands; and latching the storage data as the pre-read data based on the latch enable signals.

8. The read operation method of claim 7, wherein the selecting and latching of the read data having the second bit width from the pre-read data comprise:

selecting the read data having the second bit width from the pre-read data, wherein the second bit width is one N-th of the first bit width, and N is an integer greater than or equal to 2; and latching the read data.

9. The read operation method of claim 7, wherein the latch enable signals comprise a first latch enable signal and a second latch enable signal;

reading a portion of the storage data from the storage data having the first bit width under the control of one of the first latch enable signal and the second latch enable signal; and reading another portion of the storage data from the storage data having the first bit width under the control of another one of the first latch enable signal and the second latch enable signal.

10. The read operation method of claim 9, comprising: reading the high bits or odd bits of the storage data from the storage data having the first bit width under the control of one of the first latch enable signal and the second latch enable signal; and reading low bits or even bits of the storage data from the storage data having the first bit width under the control of another one of the first latch enable signal and the second latch enable signal.

11. The read operation method of claim 7, wherein the latch enable signals comprises more than two latch enable signals; and the reading and latching of the storage data having the first bit width as the pre-read data having the first bit width based on the read commands and the latch enable signals comprise:

disposing each of the read commands to correspond to respective one of read operations, each of the read operations comprises a first read operation and at least one other read operation sequentially;

in the first read operation, reading and latching storage data having the first bit width as pre-read data having the first bit width; and in the other read operation, updating and latching respective portion of the storage data having the first bit width as the pre-read data having the first bit width under the control of at least one of the latch enable signals.

12. The read operation method of claim 11, further comprising: after the first read operation or the other read operation, selecting read data having the second bit width from the pre-read data, wherein the second bit width is one M-th of the first bit width, and M is an integer greater than or equal to 4; and latching the read data.

13. A storage chip, comprising:

a sensitive amplification module, wherein the sensitive amplification module is configured to read and latch storage data having a first bit width as pre-read data having the first bit width; and a selection latch module, wherein the selection latch module is configured to select and latch read data having a second bit width less than the first bit width from the pre-read data;

wherein the sensitive amplification module comprises a plurality of sensitive amplifiers, the plurality of sensitive amplifiers being configured to read the storage data based on one or more read commands, and a plurality of first latches, the plurality of first latches being configured to latch the pre-read data based on one or more latch enable signals;

wherein the selection latch module comprises a first selection latch submodule and a second selection latch submodule connected to each other, wherein the first selection latch submodule is configured to select and latch second pre-read data having a third bit width from the pre-read data, the third bit width being one X-th of the first bit width, and the second selection latch submodule is configured to select and latch the read data having the second bit width from the second pre-read data, the second bit width being one Y-th of the third bit width, wherein X and Y are both integers greater than or equal to 2;

wherein the first selection latch submodule includes a first data selector and a plurality of second latches, and the first data selector is connected to the sensitive amplification module and the plurality of second latches; the second selection latch submodule includes a second data selector and a plurality of third latches, and the second data selector is connected to the plurality of second latches and the plurality of third latches; and each of the second latches and the third latches is configured to latch data.

* * * * *